(12) United States Patent
Zhan

(10) Patent No.: US 11,856,756 B2
(45) Date of Patent: Dec. 26, 2023

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Mengdan Zhan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 86 days.

(21) Appl. No.: 17/659,050

(22) Filed: Apr. 13, 2022

(65) Prior Publication Data

US 2023/0013207 A1    Jan. 19, 2023

Related U.S. Application Data

(63) Continuation of application No. PCT/CN2022/076312, filed on Feb. 15, 2022.

(30) Foreign Application Priority Data

Jul. 19, 2021  (CN) .......................... 202110811874.5

(51) Int. Cl.
  *H01L 27/108*    (2006.01)
  *H10B 12/00*    (2023.01)

(52) U.S. Cl.
  CPC ........... *H10B 12/482* (2023.02); *H10B 12/31* (2023.02); *H10B 12/485* (2023.02)

(58) Field of Classification Search
  CPC ..... H10B 12/482; H10B 12/31; H10B 12/485
  See application file for complete search history.

(56) References Cited

U.S. PATENT DOCUMENTS

| 10,263,001 | B2 | 4/2019 | Huang et al. |
| 2014/0030884 | A1* | 1/2014 | Rouh ................ H01L 21/32139 438/653 |
| 2015/0111360 | A1 | 4/2015 | Kim et al. |
| 2021/0035613 | A1* | 2/2021 | Park ..................... H10B 12/485 |

FOREIGN PATENT DOCUMENTS

| CN | 108257919 A | 7/2018 |
| CN | 108878366 A | 11/2018 |
| CN | 112447602 A | 3/2021 |
| CN | 112542459 A | 3/2021 |
| KR | 19980026142 A | 7/1998 |

OTHER PUBLICATIONS

International Search Report cited in PCT/CN2022/076312 dated Apr. 2, 2022, 8 pages.

* cited by examiner

*Primary Examiner* — Mohammed R Alam
(74) *Attorney, Agent, or Firm* — Cooper Legal Group, LLC

(57) ABSTRACT

The present disclosure provides a semiconductor structure and a manufacturing method thereof, and relates to the technical field of semiconductors. The method of manufacturing the semiconductor structure includes: providing a substrate; forming, on the substrate, a first initial conductive layer, a sacrificial layer and a first mask layer with a pattern that are stacked sequentially, a thickness of the sacrificial layer being 10 nm-20 nm; and etching, with the first mask layer as a mask, the first initial conductive layer and the substrate to form a bit line (BL) contact region.

14 Claims, 5 Drawing Sheets

SEMICONDUCTOR STRUCTURE AND MANUFACTURING METHOD THEREOF

CROSS-REFERENCE TO RELATED APPLICATIONS

This is a continuation of International Application No. PCT/CN2022/076312, filed on Feb. 15, 2022, which claims the priority to Chinese Patent Application 202110811874.5, titled "SEMICONDUCTOR STRUCTURE AND MANUFACTURING METHOD THEREOF", filed with China National Intellectual Property Administration (CNIPA) on Jul. 19, 2021. The entire contents of International Application No. PCT/CN2022/076312 and Chinese Patent Application 202110811874.5 are incorporated herein by reference.

TECHNICAL FIELD

The present disclosure relates to the technical field of semiconductors, and in particular to a semiconductor structure and a manufacturing method thereof.

BACKGROUND

The dynamic random access memory (DRAM) is a semiconductor memory that randomly writes and reads data at high speeds, and is widely used in data storage devices.

A DRAM usually includes a plurality of repeated memory cells, each of which includes a transistor and a capacitor. The transistor includes a gate electrically connected to a word line (WL), a source electrically connected to a bit line (BL) through a BL contact, and a drain electrically connected to the capacitor through a memory node contact. The voltage on the WL can control the on or off of the transistor, so as to read data information in the capacitor or write data information into the capacitor through the BL.

However, during formation of BL contacts, it is likely to form gaps in the BL contacts, which increases resistances of the BL contacts and reduces the transmission performance of the semiconductor structure.

SUMMARY

According to a first aspect, an embodiment of the present disclosure provides a method of manufacturing a semiconductor structure, including:
  providing a substrate;
  forming, on the substrate, a first initial conductive layer and a sacrificial layer that are stacked sequentially, a thickness of the sacrificial layer being 10 nm-20 nm;
  forming a first mask layer with a pattern on the sacrificial layer;
  removing, with the first mask layer as a mask, the sacrificial layer, a part of the first initial conductive layer and a part of the substrate to form a BL contact region in the first initial conductive layer and the substrate, wherein a retained first initial conductive layer forms a first conductive layer, and a thickness of the first conductive layer is ⅖-⅗ of a thickness of the first initial conductive layer; and
  forming a second conductive layer in the BL contact region, the second conductive layer filling the bit line contact region.

According to a second aspect, an embodiment of the present disclosure provides a semiconductor structure, which is manufactured with the above method of manufacturing the semiconductor structure.

In addition to the technical problems solved by the embodiments of the present disclosure, the technical features constituting the technical solutions and the beneficial effects brought about by the technical features of these technical solutions, other technical problems to be solved by the semiconductor structure and the manufacturing method thereof in the embodiments of the present disclosure, other technical features included in the technical solutions and beneficial effects brought about by these technical features will be described in further detail in the detailed description.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and those of ordinary skill in the art may still derive other drawings from these accompanying drawings without creative efforts.

DETAILED DESCRIPTION

Figure 1:
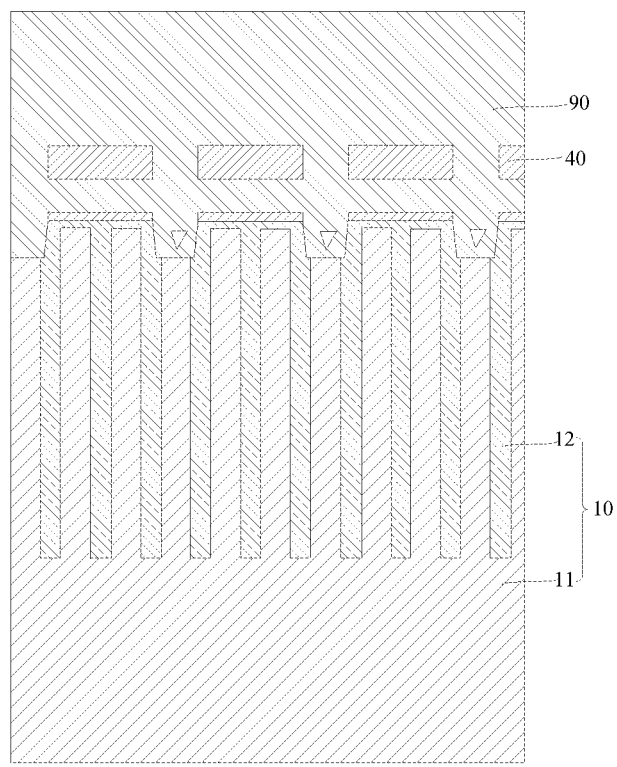
FIG. 1 is a first schematic structural diagram of a semiconductor structure according to the related art.
Figure 2:
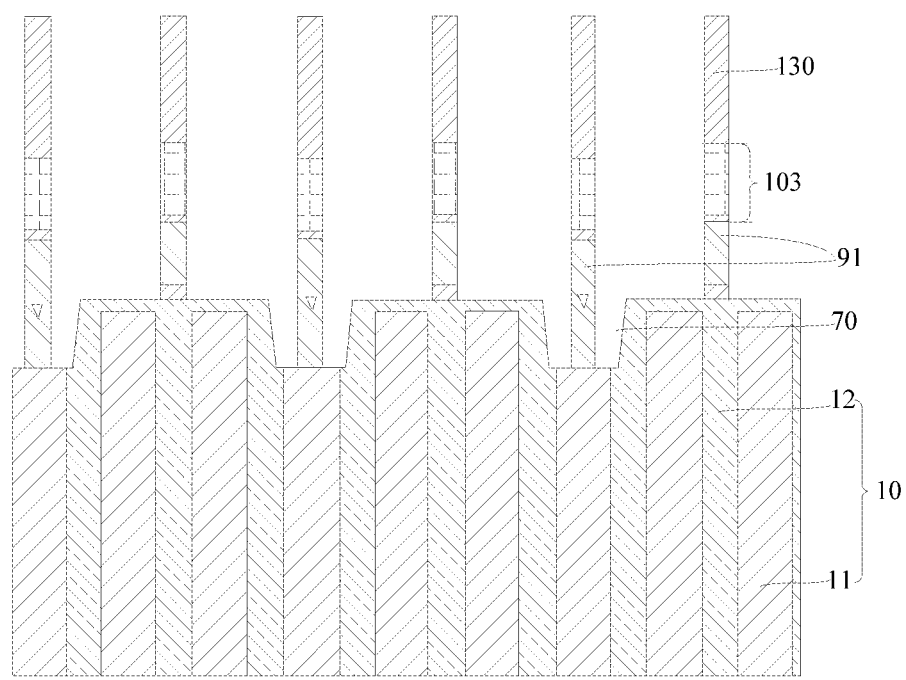
FIG. 2 is a second schematic structural diagram of a semiconductor structure according to the related art.

As described in the background art, as shown in FIG. 1 and FIG. 2, there are gaps in BL contacts of the semiconductor structure that increase the resistances of the BL contacts and reduce the transmission performance of the semiconductor structure. Through research, the inventor finds that the above problem is ascribed to the deep BL contact regions. Due to restrictions of a deposition process, it is likely to form gaps in the BL contacts during formation of the BL contacts in the BL contact regions.

In view of the above technical problem, by controlling the thickness ratio of the sacrificial layer to the first initial conductive layer, and decreasing the thickness of the sacrificial layer in the embodiment of the present disclosure, when the sacrificial layer and the first initial conductive layer are etched subsequently, the sacrificial layer is etched completely, and the first initial conductive layer originally shielded by the sacrificial layer can also be removed by a certain thickness, such that the retained first initial conductive layer is thinner and the BL contact regions are shallower. When the second conductive layer is deposited in the BL contact regions, the formation of gaps in the second conductive layer can be avoided to reduce resistances of the BL contacts and improve transmission performance of the semiconductor structure.

In order to make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely part rather than all of the embodiments of the present disclosure. All other embodiments obtained by those of ordinary skill in the art based on the embodiments of the disclosure without creative efforts shall fall within the protection scope of the present disclosure.

Figure 3:
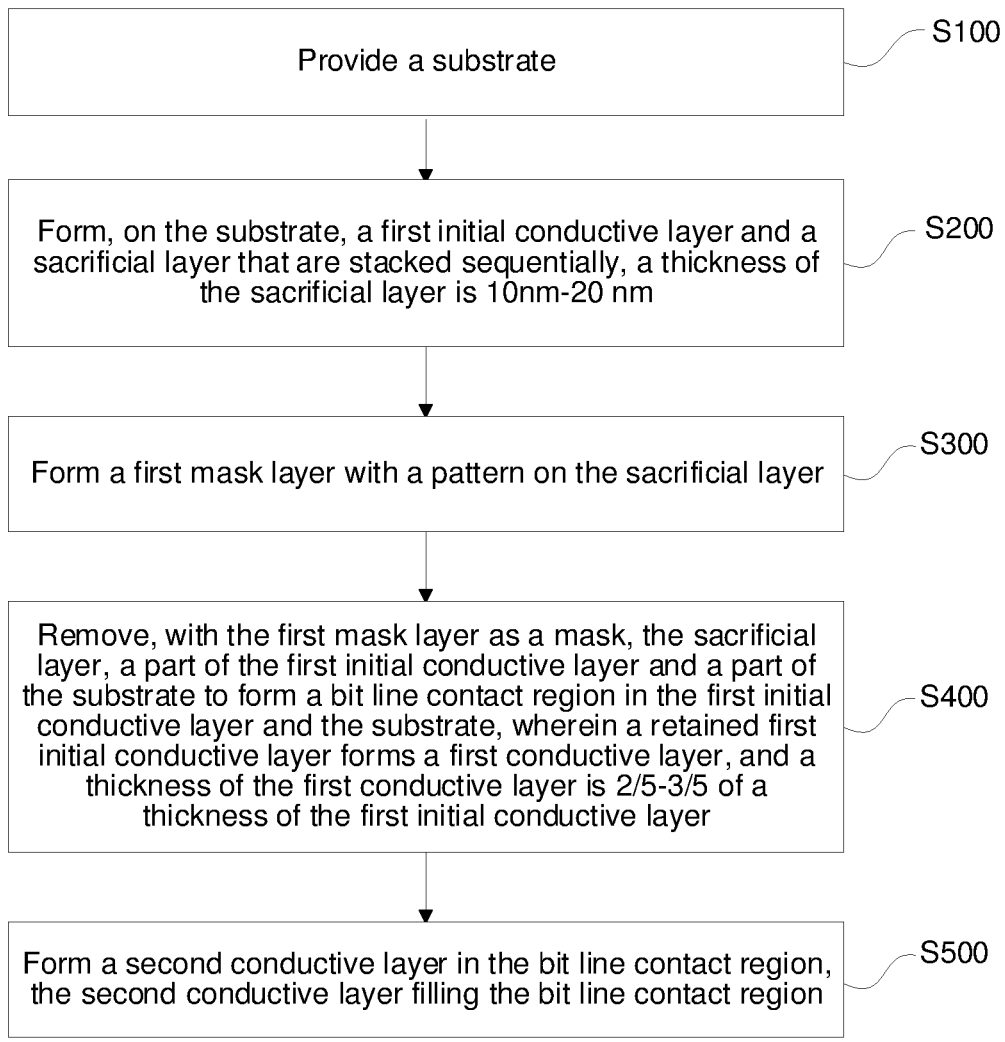
FIG. 3 is a flowchart of a method of manufacturing a semiconductor structure according to an embodiment of the present disclosure.

FIG. 3 is a flowchart of a method of manufacturing a semiconductor structure according to an embodiment of the present disclosure. FIG. 4 to FIG. 9 are schematic diagrams of various stages in a method of manufacturing a semiconductor structure. The method of manufacturing a semiconductor structure will be described in detail below with reference to FIG. 3 to FIG. 9.

There are no limits made on the semiconductor structure in the embodiment. The following descriptions will be made by taking the semiconductor structure as a DRAM for example, but the embodiment is not limited thereto. The semiconductor structure in the embodiment may also be another structure.

As shown in FIG. 3, an embodiment of the present disclosure provides a method of manufacturing a semiconductor structure, including the following steps:

Step S100: Provide a substrate.

Figure 4:
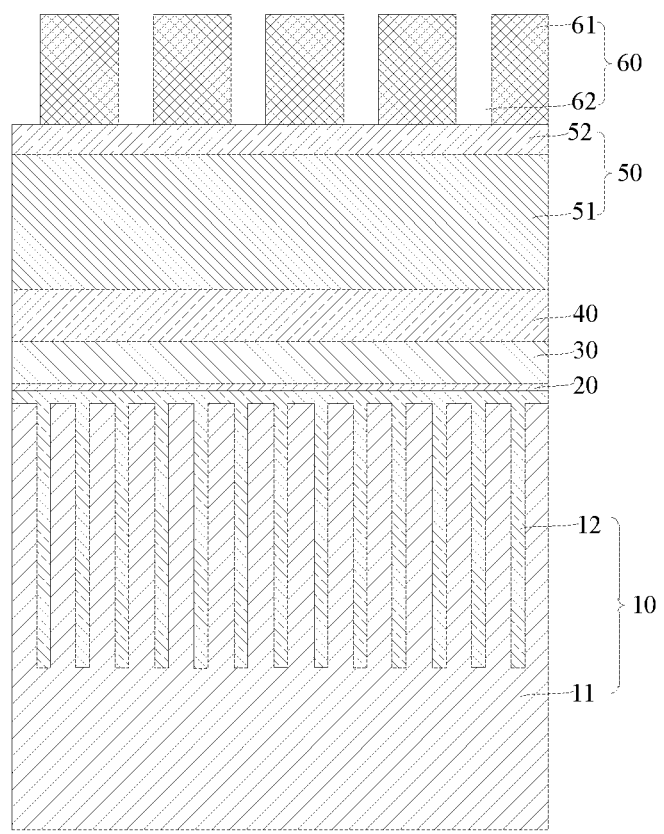
FIG. 4 is a schematic structural diagram of a first initial conductive layer, a sacrificial layer, a first mask layer and a patterned first photoresist layer formed in a method of manufacturing a semiconductor structure according to an embodiment of the present disclosure.

For example, as shown in FIG. 4, the substrate 10 serves as a support member of the DRAM and is used to support other components thereon. The substrate 10 may be made of a semiconductor material. The semiconductor material may be one or more of a group consisting of silicon, germanium, a silicon-germanium compound, and a silicon-carbon compound.

A plurality of spaced active regions 11 and isolation structures 12 for separating the active regions 11 are provided in the substrate 10. The plurality of active regions 11 may be arranged in a rectangular array. A semiconductor device such as a transistor or a WL is provided in each of the active regions 11.

In the embodiment, a first insulating layer 20 may be deposited on the substrate 10. The first insulating layer 20 implements insulation of the active regions 11 in the substrate from the subsequently formed first initial conductive layer. The first insulating layer 20 may be made of an insulating material including silicon nitride.

Step S200: Form, on the substrate, a first initial conductive layer and a sacrificial layer that are stacked sequentially, a thickness of the sacrificial layer is 10 nm-20 nm.

Exemplarily, as shown in FIG. 4, the first initial conductive layer 30 and the sacrificial layer 40 may be deposited on the substrate 10. The deposition may be atomic layer deposition (ALD), chemical vapor deposition (CVD) or physical vapor deposition (PVD).

The first initial conductive layer 30 may be made of a conductive material including polycrystalline silicon, and the sacrificial layer 40 may be made of an insulating material including silicon oxide.

It is to be noted that when the first insulating layer 20 is provided on the substrate 10, the first initial conductive layer 30 is provided on the first insulating layer 20.

Step S300: Form a first mask layer with a pattern on the sacrificial layer.

Exemplarily, a first photoresist layer 60 is formed on the first mask layer 50.

The first photoresist layer 60 may be coated on the first mask layer 50.

The first photoresist layer 60 is patterned by exposure, developing or etching to form a first mask pattern in the first photoresist layer 60. The first mask pattern includes a plurality of spaced first opening regions 62 and first shielding regions 61 for separating the first opening regions 62.

The first mask layer 50 exposed in the first opening regions 62 is removed by using an etching solution or etching gas to form a pattern in the first mask layer 50.

In the embodiment, the first mask layer 50 may be a single film layer, and may also be a stacked layer. When the first mask layer 50 is the stacked layer, the first mask layer 50 may include a first hard mask layer 51 and a first silicon oxynitride layer 52 that are stacked sequentially. The first hard mask layer 51 is provided on the sacrificial layer 40.

In the embodiment, by providing the first mask layer 50 as the stacked structure, the accuracy of the pattern on the first photoresist layer 60 during transferring can be ensured, and the accuracy of the subsequently formed BL contact regions can be improved.

Figure 5:
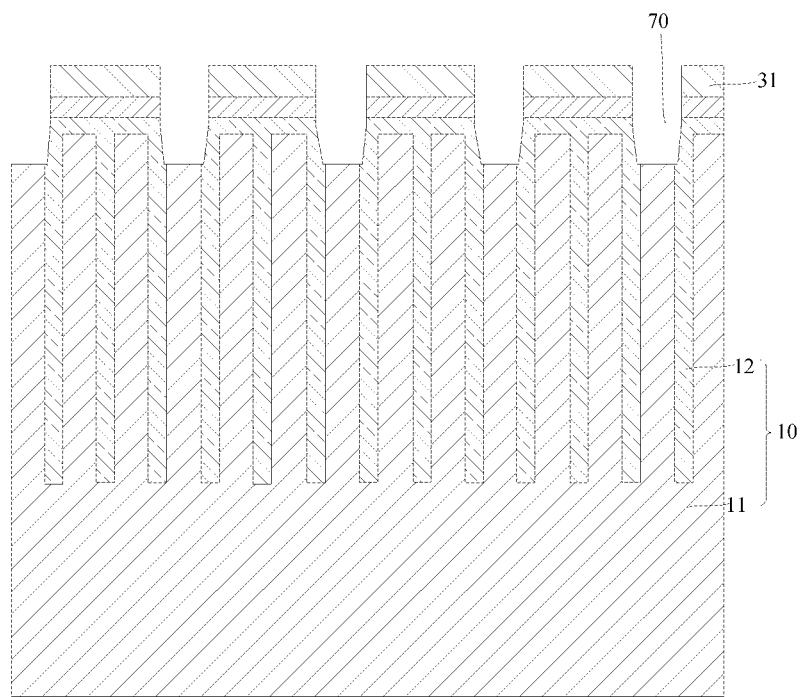
FIG. 5 is a schematic structural diagram of a BL contact region formed in a method of manufacturing a semiconductor structure according to an embodiment of the present disclosure.

Step S400: Remove, with the first mask layer as a mask, the sacrificial layer, a part of the first initial conductive layer and a part of the substrate to form BL contact regions in the first initial conductive layer and the substrate, wherein a retained first initial conductive layer forms a first conductive layer, and a thickness of the first conductive layer is ⅖-⅗ of a thickness of the first initial conductive layer, as shown in FIG. 5.

In the step herein, when the first mask layer 50 is used as the mask and the sacrificial layer 40 is removed with the etching gas, as the thickness of the sacrificial layer 40 is 10 nm-20 nm and is thinner than the sacrificial layer 40 having the thickness of 48-52 nm, the sacrificial layer 40 originally shielded by the first mask layer 50 is also removed when the sacrificial layer 40 is patterned, and the whole sacrificial layer 40 is completely etched. When the first initial conductive layer 30 is continuously etched, the first initial conductive layer 30 originally shielded by the first mask layer 50 is also be removed by a certain thickness, and the thickness of the final first conductive layer 31 is ⅖-⅗ of the thickness of the first initial conductive layer 30. By doing so, the BL contact regions can be shallower, gaps during subsequent formation of the second conductive layer in the BL contact regions can be avoided, the resistances of BL contacts can be reduced, and the transmission performance of the semiconductor structure can be improved.

In the embodiment, it is to be noted that the BL contact regions 70 are configured to expose the active regions 11 to facilitate electrical connections between the subsequently formed BL contacts and the active regions 11.

Through repeated demonstrations of the inventor, if the BL contact regions 70 are deeper than 42 nm, depths of the BL contact regions will be increased excessively. As a result, during subsequent formation of the second conductive layer, it is likely to form gaps in the second conductive layer to affect the transmission performance of the semiconductor structure. If the BL contact regions are shallower than 34 nm, depths of the BL contact regions will be decreased and thus the height of the subsequently formed second conductive layer is reduced to affect electrical connections between the BLs and the active regions and the transmission performance of the semiconductor structure. Therefore, by providing the BL contact regions to be 34 nm-42 nm deep in the embodiment, the formation of the gaps in the second conductive layer can be avoided, and the transmission performance of the semiconductor structure can be ensured.

Step S500: Form a second conductive layer in the BL contact regions, the second conductive layer filling the bit line contact regions.

The conductive material can be deposited in the BL contact regions 70. The conductive material can fill the BL contact regions 70 to form the second conductive layer 81. Both the second conductive layer 81 and the first conductive layer 31 are made of a same material and may be made of a same conductive material including polycrystalline silicon.

Figure 6:
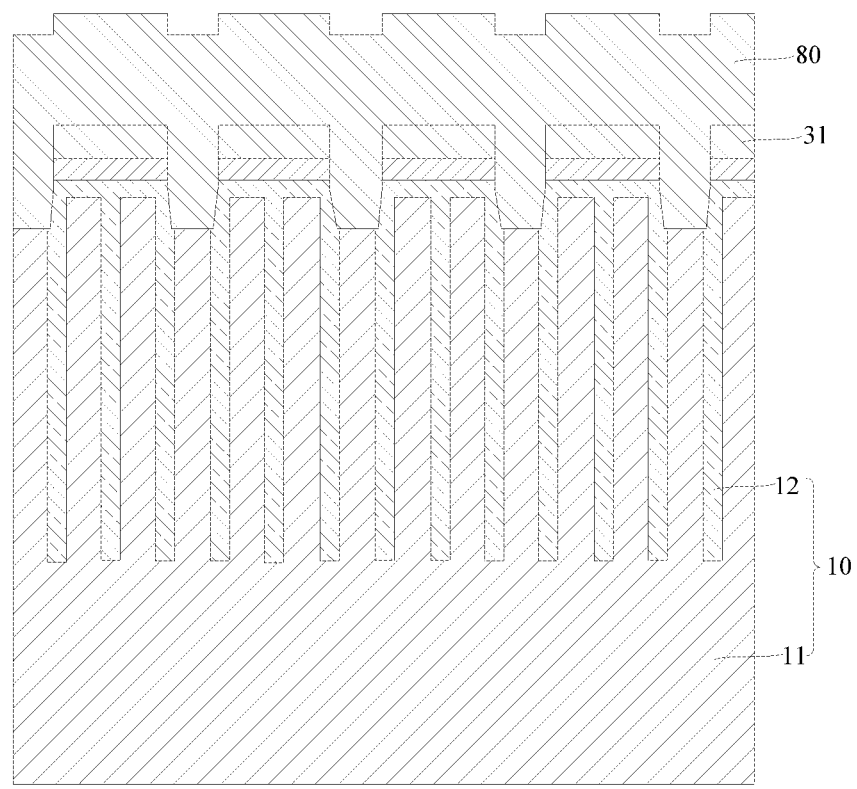
FIG. 6 is a schematic structural diagram of a second initial conductive layer formed in a method of manufacturing a semiconductor structure according to an embodiment of the present disclosure.

Exemplarily, as shown in FIG. 6, a second initial conductive layer 80 may be formed in the BL contact regions 70 through the CVD or the PVD. The second initial conductive layer 80 extends out of the BL contact regions 70 and covers the first conductive layer 31.

Figure 7:
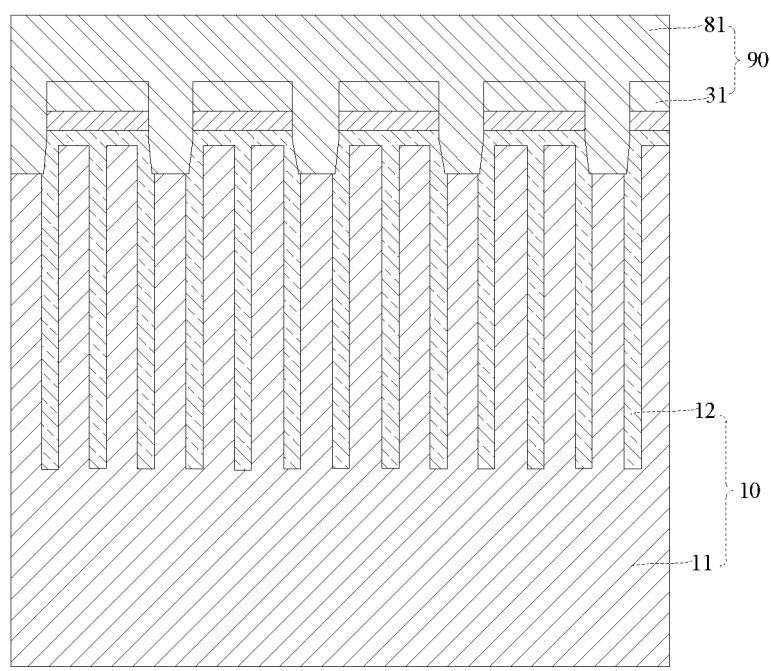
FIG. 7 is a schematic structural diagram of a BL contact layer formed in a method of manufacturing a semiconductor structure according to an embodiment of the present disclosure.

As shown in FIG. 7, the second initial conductive layer 80 may be removed by a certain thickness with CMP, such that a retained second initial conductive layer 80 forms the second conductive layer 81, and the second conductive layer 81 and the first conductive layer 31 are connected into a whole to form a BL contact layer 90.

In the embodiment, through planarization on a top surface of the second initial conductive layer 80 with the CMP, the top surface of the BL contact layer 90 formed by the first conductive layer 31 and the second conductive layer 81 is parallel to a horizontal plane, thereby avoiding the height difference between BLs subsequently formed on the BL contact layer and ensure the performance of the BLs.

It is to be noted that the top surface of the BL contact layer 90 may be higher than the top surface of the first conductive layer 31, and may also be flush with the top surface of the first conductive layer 31 in the embodiment.

In some embodiments, after the step that the second initial conductive layer is removed by a certain thickness, such that a retained second initial conductive layer forms the second conductive layer, and the second conductive layer and the first conductive layer are connected into a whole to form a BL contact layer, the manufacturing method further include the following step.

Figure 8:
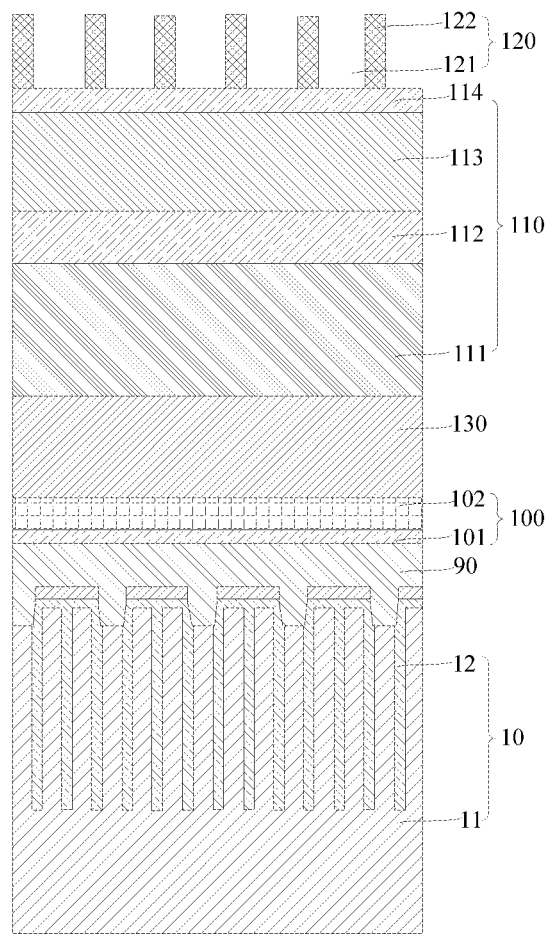
FIG. 8 is a schematic structural diagram of a BL conductive layer, a second insulating layer, a second mask layer and a patterned second photoresist layer formed in a method of manufacturing a semiconductor structure according to an embodiment of the present disclosure.

As shown in FIG. 8, a BL conductive layer 100 and a second mask layer with a pattern 110 that are stacked sequentially are formed on the BL contact layer 90.

Exemplarily, the BL conductive layer 100 may be deposited on the BL contact layer 90. For example, a first BL conductive layer 101 and a second BL conductive layer 102 that are stacked sequentially are formed on the BL contact layer 90. The first BL conductive layer 101 is provided on the BL contact layer 90.

The first BL conductive layer 101 may be made of a material including titanium nitride, and the second BL conductive layer 102 may be made of a material including tungsten. In addition to the conductive function, the first BL conductive layer 101 has a barrier function to prevent diffusion of the conductive material in the second BL conductive layer 102 to the substrate 10 or the BL contact layer 90, and ensure the conductive performance of the subsequently formed BLs.

After the formation of the BL conductive layer 100, the second mask layer 110 may be deposited on the BL conductive layer 100. The second mask layer 110 may be a single film layer, and may also be a stacked layer. When the second mask layer 110 is the stacked layer, the second mask layer 110 may include an amorphous carbon layer 111, a second silicon oxynitride layer 112, a second hard mask layer 113 and a third silicon oxynitride layer 114 that are stacked sequentially. The amorphous carbon layer 111 is provided on the BL conductive layer 100.

A second photoresist layer 120 may be formed on the second mask layer 110. For example, the second photoresist layer 120 may be coated on the second mask layer 110.

The second photoresist layer 120 is patterned by exposure, developing or etching to form a second mask pattern in the second photoresist layer 120. The second mask pattern includes a plurality of spaced second opening regions 121 and second shielding regions 122 for separating the second opening regions 121.

The second mask layer 110 exposed in the second opening regions 121 is removed by using an etching solution or etching gas to form a pattern in the second mask layer 110.

In the embodiment, by providing the second mask layer 110 as the stacked layer, the second mask pattern of the second photoresist layer 120 may be transferred to the third silicon oxynitride layer 114 first and then to the second hard mask layer 113, the second silicon oxynitride layer 112 and the amorphous carbon layer 111, thereby ensuring the accuracy of the pattern on the second photoresist layer 120 in transferring, and improving the accuracy of the subsequently formed BLs.

Figure 9:
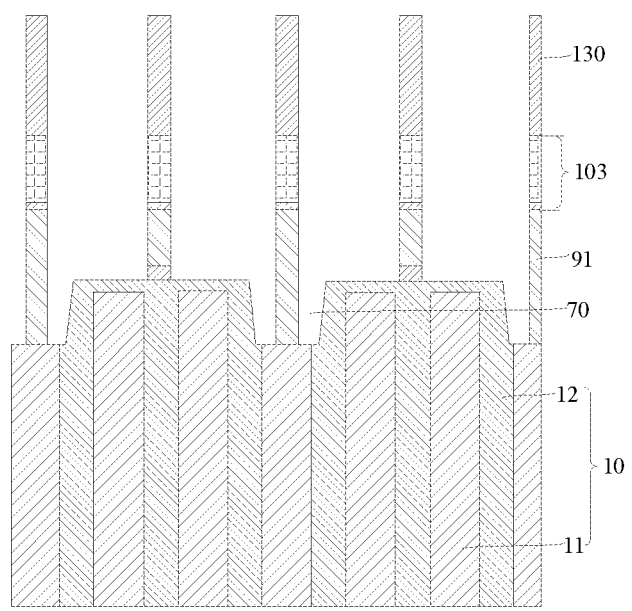
FIG. 9 is a schematic structural diagram of a BL and a BL contact formed in a method of manufacturing a semiconductor structure according to an embodiment of the present disclosure.

As shown in FIG. 9, after the formation of the second mask layer with the pattern 110, with the patterned second mask layer 110 as a mask, a part of the BL conductive layer 100 and a part of the BL contact layer 90 are removed, such that a retained BL conductive layer 100 is formed into BLs 103, and a retained BL contact layer 90 is formed into BL contacts 91.

It is to be noted that a bottom of each of the BLs 103 is provided with one of the BL contacts 91. At least one of the BL contacts 91 contacts the active regions 11 in the substrate 10, and remaining BL contacts 91 do not contact the active regions 11 in the substrate 10.

In the embodiment, because of the planarization on the second initial conductive layer, there is a fixed perpendicular distance from the top surface of each of the BLs to the top surface of the substrate, namely the top surfaces of the BLs are flush, to ensure the performance of the BLs.

In some embodiments, in the step that a BL conductive layer and a patterned second mask layer that are stacked sequentially are formed on the BL contact layer, the method of manufacturing a semiconductor structure includes: A second insulating layer 130 is deposited on the BL conductive layer 100. The second insulating layer 130 is made of a material including silicon nitride, which can avoid electrical connections of the BL conductive layer 100 with other subsequently formed devices on the second insulating layer 130.

An embodiment of the present disclosure further provides a semiconductor structure, which is obtained with the method of manufacturing a semiconductor structure in the above embodiment. The semiconductor structure has the beneficial effects of the above embodiment, which will not be repeated herein.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same embodiment or example. Moreover, the described specific feature, structure, material or characteristic may be combined in an appropriate manner in any one or more embodiments or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

The invention claimed is:

1. A method of manufacturing a semiconductor structure, comprising:
    providing a substrate;
    forming, on the substrate, a first initial conductive layer and a sacrificial layer that are stacked sequentially, a thickness of the sacrificial layer being 10 nm-20 nm;
    forming a first mask layer with a pattern on the sacrificial layer;
    removing, with the first mask layer as a mask, the sacrificial layer, a part of the first initial conductive layer and a part of the substrate to form a bit line contact region in the first initial conductive layer and the substrate, wherein a retained first initial conductive layer forms a first conductive layer, and a thickness of the first conductive layer is ⅖-⅗ of a thickness of the first initial conductive layer; and
    forming a second conductive layer in the bit line contact region, the second conductive layer filling the bit line contact region.

2. The method of manufacturing the semiconductor structure according to claim 1,
    wherein a depth of the bit line contact region is 34 nm-42 nm.

3. The method of manufacturing the semiconductor structure according to claim 2, wherein the forming a first mask layer with a pattern on the sacrificial layer comprises:
    forming a first photoresist layer on the first mask layer;
    patterning the first photoresist layer to form a first mask pattern in the first photoresist layer, wherein the first mask pattern comprises a plurality of first opening regions arranged at intervals and a first shielding region for separating each of the first opening regions; and
    removing the first mask layer exposed in the first opening region, to form a pattern in the first mask layer.

4. The method of manufacturing the semiconductor structure according to claim 3, wherein the forming a second conductive layer in the bit line contact region comprises:
    forming a second initial conductive layer in the bit line contact region, the second initial conductive layer extending out of the bit line contact region, and covering the first conductive layer; and
    removing the second initial conductive layer by a certain thickness, such that a retained second initial conductive layer forms the second conductive layer, and the second conductive layer and the first conductive layer are connected into a whole to form a bit line contact layer.

5. The method of manufacturing the semiconductor structure according to claim 4, wherein the second initial conductive layer is removed by the certain thickness with chemical mechanical polishing.

6. The method of manufacturing the semiconductor structure according to claim 1, wherein the first mask layer comprises a first hard mask layer and a first silicon oxynitride layer that are stacked sequentially, and the first hard mask layer is provided on the sacrificial layer.

7. The method of manufacturing the semiconductor structure according to claim 6, after the providing a substrate, and before the forming, on the substrate, a first initial conductive layer and a sacrificial layer that are stacked sequentially, further comprising:
    forming a first insulating layer on the substrate.

8. The method of manufacturing the semiconductor structure according to claim 7, wherein the first conductive layer and the second conductive layer are made of a same material comprising polycrystalline silicon.

9. The method of manufacturing the semiconductor structure according to claim 8, wherein the sacrificial layer is made of a material comprising silicon oxide; and the first insulating layer is made of a material comprising silicon nitride.

10. The method of manufacturing the semiconductor structure according to claim 4, after the removing the second initial conductive layer by a certain thickness, such that a retained second initial conductive layer forms the second conductive layer, and the second conductive layer and the first conductive layer are connected into a whole to form a bit line contact layer, further comprising:
    forming, on the bit line contact layer, a bit line conductive layer and a second mask layer with a pattern that are stacked sequentially; and
    removing, with the second mask layer with the pattern as a mask, a part of the bit line conductive layer and a part of the bit line contact layer, such that a retained bit line conductive layer forms a bit line, and a retained bit line contact layer forms a bit line contact.

11. The method of manufacturing the semiconductor structure according to claim 10, wherein the forming, on the bit line contact layer, a bit line conductive layer and a second mask layer with a pattern that are stacked sequentially comprises:
    forming a second photoresist layer on the second mask layer;
    patterning the second photoresist layer to form a second mask pattern in the second photoresist layer, wherein the second mask pattern comprises a plurality of second opening regions arranged at intervals and a second shielding region for separating each of the second opening regions; and
    removing the second mask layer exposed in the second opening region, to form a pattern in the second mask layer.

12. The method of manufacturing the semiconductor structure according to claim 11, wherein the second mask layer comprises an amorphous carbon layer, a second silicon oxynitride layer, a second hard mask layer and a third silicon oxynitride layer that are stacked sequentially, and the amorphous carbon layer is provided on the bit line conductive layer.

13. The method of manufacturing the semiconductor structure according to claim 12, wherein the bit line conductive layer comprises a first bit line conductive layer and a second bit line conductive layer that are stacked sequentially, and the first bit line conductive layer is provided on the bit line contact layer.

14. The method of manufacturing the semiconductor structure according to claim 13, wherein the forming, on the bit line contact layer, a bit line conductive layer and a second mask layer with a pattern that are stacked sequentially further comprises:

forming a second insulating layer on the bit line conductive layer.

* * * * *